United States Patent
Niehoff (10) Patent No.: US 7,420,652 B2
(45) Date of Patent: Sep. 2, 2008

(54) IMMERSION LITHOGRAPHY METHOD AND DEVICE FOR ILLUMINATING A SUBSTRATE

(75) Inventor: Martin Niehoff, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/386,483

(22) Filed: Mar. 22, 2006

(65) Prior Publication Data

US 2006/0221317 A1    Oct. 5, 2006

Related U.S. Application Data

(63) Continuation of application No. PCT/DE2004/002022, filed on Sep. 10, 2004.

(30) Foreign Application Priority Data

Sep. 25, 2003   (DE)   ................ 103 44 567

(51) Int. Cl.
    G03B 27/42    (2006.01)
    G03B 27/52    (2006.01)

(52) U.S. Cl. .......................................... 355/53; 355/55

(58) Field of Classification Search ............... 355/30, 355/52, 53, 55, 67, 77
See application file for complete search history.

(56) References Cited

U.S. PATENT DOCUMENTS

| | | | | |
|---|---|---|---|---|
| 5,610,683 | A * | 3/1997 | Takahashi | ............ 355/53 |
| 5,825,043 | A * | 10/1998 | Suwa | ............ 250/548 |
| 5,879,845 | A | 3/1999 | Takahashi | |
| 6,191,429 | B1 | 2/2001 | Suwa | |
| 6,473,156 | B2 * | 10/2002 | Kataoka | ............ 355/53 |
| 6,509,952 | B1 | 1/2003 | Govil et al. | |
| 6,586,160 | B2 | 7/2003 | Ho et al. | |
| 7,038,762 | B2 * | 5/2006 | Boettiger et al. | ............ 355/53 |
| 2005/0264780 | A1 * | 12/2005 | Graeupner | ............ 355/53 |

FOREIGN PATENT DOCUMENTS

| | | |
|---|---|---|
| EP | 0 605 103 A1 | 11/1993 |
| JP | 10-303 114 A | 11/1998 |

* cited by examiner

*Primary Examiner*—Hung Henry Nguyen
(74) *Attorney, Agent, or Firm*—Brinks Hofer Gilson & Lione (57) ABSTRACT

The invention relates to an immersion lithography method which illuminates a substrate positioned on a carrier. When a substrate is illuminated, an immersion fluid is introduced between a reproducing element and the substrate and the field depth or the resolution, or both, are adjusted by varying the distance in the direction of the beam between an illuminating reticule and the surface of the substrate along a direction of movement of the carrier.

21 Claims, 3 Drawing Sheets

IMMERSION LITHOGRAPHY METHOD AND DEVICE FOR ILLUMINATING A SUBSTRATE

PRIORITY CLAIM

This application is a continuation of PCT patent application No. PCT/DE2004/002022, filed Sep. 10, 2004, which claims the benefit of priority to German Patent Application No. DE 10344567.6, filed Sep. 25, 2003, both of which are incorporated herein by reference.

TECHNICAL FIELD

The invention relates to an immersion lithography method and a device for the exposure of a substrate.

BACKGROUND

In the production of large scale integrated semiconductor chips, ever more stringent requirements made of the fabrication installations and production processes used for the production of the semiconductor chips occur in particular by virtue of the ever advancing miniaturization of the structures on the semiconductor chip. One problem which occurs with the rising miniaturization of the large scale integrated semiconductor chips is the limitation of the miniaturization by the resolution capability of the lithography technology used which is employed for patterning the semiconductor chips of a wafer.

Figure 6:
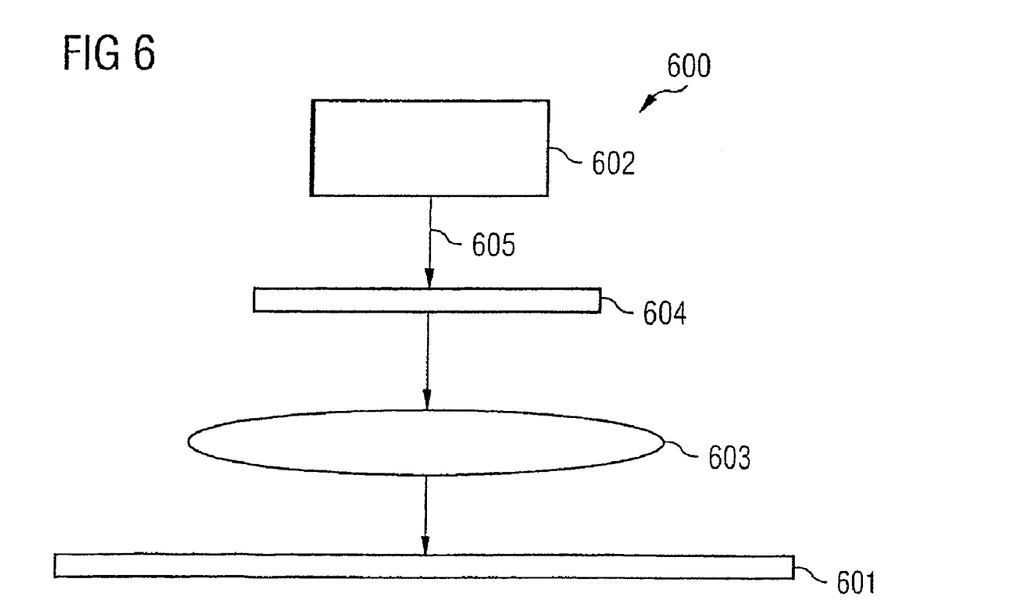
FIG. 6 shows a schematic simplified illustration of a lithography device in accordance with the prior art.

As an introduction, a lithography device 600 that can be used for patterning a wafer 601 is illustrated schematically in a simplified manner in FIG. 6. The lithography device 600 has an illumination unit 602 and a lens 603. The wafer 601 is patterned by being exposed using a mask 604 or reticle. For this purpose, a structure formed on the mask is imaged by means of laser light 605 and the illumination unit through the lens 603 onto the wafer 601, that is to say that the wafer 601 is exposed and a patterning of the wafer is thus possible.

Various methods for carrying out the lithography are known in the prior art. One is the use of a so-called "stepper". When using such a stepper, an entire mask used is transferred all at once within a single exposure step onto a first exposure field of the wafer. Afterward, the wafer is moved on and the next exposure field of the wafer is exposed.

Another method which is used in lithography is one which is carried out by means of a so-called "scanner". In the case of a scanner, the entire structure of a mask is not imaged onto a first exposure field of the wafer in one step, rather only a narrow strip of the mask is ever imaged all at once onto an exposure field of the wafer. For this purpose, a so-called exposure slot is used, which only ever illuminates a narrow strip of the mask and through which the mask is moved. During the exposure of an exposure field, the entire field gradually moves through the exposure slot. The mask is clearly scanned by means of this exposure slot. During the imaging of the mask onto a field of the wafer, both the mask and the wafer are moved. In this case, the movement of the wafer and of the mask generally takes place in opposite directions. To put it clearly, the mask is scanned by means of the exposure slot. In this case, every point on the mask is exposed during the movement through the movement slot with a plurality of laser flashes (pulses) onto the wafer.

The resolution of a lithography technology is given by equation (1):

$$R = k_1 \cdot \frac{\lambda}{n \cdot \sin(\theta)}$$

where: R is the resolution,
$k_1$ is a process-dependent factor,
$\lambda$ is the vacuum wavelength of the beam used for the lithography, and
$n \cdot \sin(\theta)$ is the so-called numerical aperture, where n is the refractive index of the medium in which the lithography is carried out, and $\theta$ is the aperture angle of the lens.

The process-dependent factor $k_1$ has a value of greater than 0.25 for physical reasons. Clearly, $k_1$ is greater than 0.25 in order to ensure that a uniform pattern of lines and interspaces, that is to say an alternation of bright and dark, can be imaged and is still discernible as such a pattern. In lithography, the wavelength is currently still limited to wavelengths of more than approximately 150 nm, since no materials which are transparent to light having a shorter wavelength are known to date.

It emerges from these boundary conditions that in order to increase the resolution capability, which increase is necessary for a lithography for the patterning of small structures, it is scarcely possible to make a change to $k_1$ or to $\lambda$. Consequently, the only factor that remains is $n \cdot \sin(\theta)$, the so-called numerical aperture of the device, which is also designated as NA. In this case, it must be taken into consideration that $\sin(\theta) \leq 1$ holds true for mathematical reasons. Clearly, $\theta$ specifies the aperture angle at which light can enter into an imaging element (lens) in order that it also leaves the imaging element again without being subjected to total reflection, and is therefore a measure of the light intensity entering into the imaging element and the resolution capability of the lithography device.

Lithographic methods in semiconductor production have usually been carried out by means of air as the immersion medium, that is to say as the medium situated between the imaging element and the substrate. A refractive index of $n \approx 1$ thus results. If the lithographic method is carried out with a medium different than air, that is to say if a so-called immersion lithography is carried out, then the resolution capability can be improved by a factor which is equal to the refractive index of the immersion medium. In the case of such an immersion method, a liquid having a refractive index of $n > 1$ is introduced into an interspace between an imaging element, that is to say e.g. a lens, and a lithography device.

The use of an immersion medium makes it possible to have the effect that additional light contributes to the light intensity of the imaging element. Light which is incident in the imaging element at an angle which is too large to still contribute to the light intensity of the imaging element given an immersion medium of air, that is to say would be subjected to total reflection, can still contribute to the light intensity given the use of an immersion medium with a higher refractive index than n=1. As a result of this, it is possible to obtain a better resolution, or the depth of focus of the imaging can be increased for the same resolution.

One disadvantage of immersion lithography, however, is that the immersion medium absorbs part of the light which is used for the exposure of the wafer. The immersion medium is heated as a result of the absorption. The heating of the immersion medium in turn leads to a change in the refractive index of the immersion medium. For water, there are estimations for the change in the refractive index with the temperature T which amount to approximately $dn/dT=10^{-4}K^{-1}$ for a wavelength of $\lambda=193$ nm.

This in turn leads to a slight change in the distance between the imaging element and the wafer, at which distance the best focusing can be obtained, that is to say that the imaging is sharpest or, to put it another way, the resolution takes up the smallest value. The change in the temperature and hence in the refractive index of the liquid also leads to a reduction of the depth of focus (DoF) of the imaging. In a lithography method, the depth of focus of the projected image, that is to say the image of the mask, is thereby reduced, thus resulting in a reduction of a processing window for the lithography method, that is to say which fluctuation range the lithography parameters are permitted to have.

One approach to solving this problem lies in controlling the temperature of the immersion liquid. That is to say that it is attempted to keep the temperature as far as possible constant and to stabilize it within a small temperature interval. However, this has to be effected very exactly. Such exact temperature control is costly and can only be achieved with difficulty. Focal changes that remain furthermore have an adverse influence on the depth of focus of the imaging and on the resolution of the lithography method.

In order approximately to specify the order of magnitude of how exactly the temperature is to be complied with and how great the influence is of a change in temperature that remains, this will be estimated on the basis of an example. For a wavelength of $\lambda=193$ nm, a refractive index of $n=1.47$ (deionized water), a $\sin(\theta)=0.75$ and a working distance, that is to say a distance between the imaging element and the wafer surface to be patterned, of $D=1$ mm, $\delta n<6\cdot10^{-7}$ has to be complied with if a change in the distance of sharp imaging of $\Delta D<1$ nm is intended to be complied with, where $\delta n$ is the change in the refractive index. From $\delta n<6\cdot10^{-7}$ and the estimation of $dn/dT=10^{-4}K^{-1}$ already discussed above, it is possible to calculate on the basis of equation (2)

$$\Delta D = \frac{D \cdot \delta n}{n \cdot \cos^2\theta}$$

how exactly the temperature must be controlled and regulated. A required accuracy of 6 mK results. This accuracy of the temperature control can be complied with only with difficulty, as a result of which the use of immersion lithography in the patterning of semiconductor elements is greatly impeded and made greatly difficult.

U.S. Pat. No. 6,191,429 to Suwa discloses a focusing device which has an objective system for optically producing a workpiece, for forming a desired pattern on a surface of a workpiece or for inspecting a pattern on a workpiece, and which is used to set the focus state between the surface of the workpiece and the objective system.

U.S. Pat. No. 6,586,160 to Ho, et al. discloses a scanning exposure system which provides light which comprises items of pattern information which are intended to be transferred onto a wafer, and thus patterns a photoresist layer on the semiconductor wafer.

Japanese Patent No. JP10303114 discloses an immersion lithography device, a working distance between the device and a workpiece satisfying a relation which takes account of the temperature coefficient of the refractive index of the immersion fluid and the temperature.

U.S. Pat. No.6,509,952 to Govil, et al. discloses that linewidth control parameters vary within a pattern as a consequence of properties of a lithography device, and that these variations can be compensated for by means of linewidth offset coefficients.

SUMMARY

The invention is based on the problem of solving the above-mentioned disadvantages of the prior art and of providing an immersion lithography method for the exposure of a substrate and a device for such a method which reduce the problem of the accurate temperature control during the immersion lithography.

The problem is solved by means of an immersion lithography method for the exposure of a substrate and a device for carrying out such a method comprising the features in accordance with the independent patent claims.

An immersion lithography method for the exposure of a substrate is carried out by means of a scanning exposure device having a beam source, which generates a beam, a holder, which accommodates a reticle, a carrier, on which a substrate is arranged, and an imaging element, which is arranged between the reticle and the substrate, in which case, during the exposure of the substrate, an immersion fluid is introduced between the imaging element and the substrate, and in which case, during the method, the beam passes from the radiation source through the reticle, through the imaging element and through the immersion fluid onto a substrate surface to be exposed, the beam scans the reticle in a first direction, the carrier is moved in a second direction during the exposure of the substrate and the depth of focus and/or resolution of the exposure, or, to put it another way, the position of best focus during the exposure, of the surface of the substrate is set by varying during the exposure with the reticle a distance in the beam direction between the reticle and the surface of the substrate along the direction of movement of the carrier.

A device for carrying out an immersion lithography for the exposure of a substrate has a beam source for emitting a beam, a carrier, on which a substrate can be arranged, a holder for accommodating a reticle, and an imaging element, which is arranged between the holder and the carrier. In the device, the carrier and the holder are set up in such a way that they can be moved in relation to one another, and the arrangement is set up in such a way that an immersion fluid can be introduced between the imaging element and the carrier. Furthermore, the arrangement is set up in such a way that a reticle arranged in the holder and a surface to be exposed of a substrate arranged on the carrier are tilted in relation to one another during the exposure of the surface of the substrate.

The invention can clearly be seen in the fact that a reduction of the depth of focus and/or an increase in the resolution which as a result of the heating of an immersion liquid, which heating is brought about by a beam, e.g. laser beam, and leads to a shift of the best focus position, is not prevented solely by a control of the temperature of the immersion liquid, but rather by means of a tilted arrangement of the reticle and the carrier, on which a substrate to be patterned is arranged, that is to say a substrate having a surface to be exposed. Clearly, the distance between the reticle and the substrate surface to be exposed increases or decreases in the direction of movement of the carrier. To put it another way, the reticle in the holder and the substrate surface to be exposed are not oriented parallel to one another, but rather are at a relative angle with respect to one another. The arrangement is configured such that it enables the change in the position of the best focus to be compensated for by means of the varying distance between the reticle and the substrate surface to be exposed which results from said relative angle. That is to say that the $\Delta D$ from equation (2) which results for a given rise in temperature is not prevented by controlling the temperature, but rather is compensated for by means of an additional ΔD which results from the relative angle between the reticle and the substrate surface to be exposed.

To put it another way, the normal vector of the substrate surface to be exposed, which to a good approximation represents a plane area, and the normal vector of the reticle, which to a good approximation represents a plane area, are not oriented parallel or antiparallel, but rather are at the relative angle. The position of the best focus can be understood to be the position in which the depth of focus and/or resolution in the position is best, that is to say the depth of focus is greatest and/or the resolution is smallest.

The arrangement according to the invention and the method according to the invention have the advantage that they make it significantly simpler to prevent the adverse influences of the heating of the immersion fluid on the depth of focus and/or resolution. The relative angle and thus the distance between the reticle and the substrate surface to be exposed can be measured and regulated significantly more easily than a temperature which, as described above, is to be regulated accurately to a few mK.

The setting of the depth of focus and/or the resolution involves, in particular, keeping constant the depth of focus and/or resolution during the exposure of an individual electronic component to be patterned on the substrate.

Preferred developments of the invention emerge from the dependent claims. In this case, preferred developments of the immersion lithography method for the exposure of a substrate also apply to the device, and vice versa. Preferably, the distance is varied in such a way that the change in depth of focus and/or resolution caused during the exposure by a change in temperature of the immersion fluid during the exposure is compensated for.

In one development, the immersion fluid is a fluid having a high transparency at a given exposure wavelength and/or having a small dn/dT.

A high transparency of the immersion fluid, e.g. a liquid, at the exposure wavelength used during the method leads to a low absorption during the exposure, thus to a lower input of energy into the immersion fluid and thus also to less heating. A small dn/dT in turn leads to an only small change in the refractive index for a given change in temperature and thus to an only small change in the position of the best focus. The transparency is preferably more than 0.9, particularly preferably more than 0.95. The dn/dT is preferably less than $10^{-3}$, particularly preferably less than approximately $10^{-4}$.

The immersion fluid may be water or a perfluoropolyether.

Water and perfluoropolyether have a high refractive index in conjunction with good transmission properties, that is to say good beam transmissivity. Consequently, it is possible to effectively prevent the total reflection when the beam emerges from the imaging element, and to increase the numerical aperture. This in turn leads to an improved resolution or to an improved depth of focus for the same resolution. The water used is preferably high-purity deionized water, because gases, such as oxygen for example, and solids, such as impurity atoms for example, dissolved in the water influence the optical properties of the water. In particular, it is possible to use water as the immersion medium at a wavelength of 193 nm used for the lithography, and to use perfluoropolyethers, such as, for example, that known by the trade name Krytox®, for the lithography at a wavelength of 157 nm.

Preferably, the carrier is moved obliquely with respect to the reticle. That is to say that the carrier is not moved parallel to a main direction of the reticle, which to a good approximation represents a plane area, rather it is moved obliquely, that is to say at a relative angle with respect to the main direction of the reticle. The oblique movement of the carrier makes it possible to achieve in a simple manner the variation of the distance between the reticle and the substrate surface to be exposed, which substrate is arranged onto the carrier, along the direction of movement. As a result of this, a ΔD which is caused by the change in the refractive index of the immersion fluid as a result of the rise in temperature during the scanning of the reticle can be compensated for easily and the resolution of the exposure can be improved and/or the depth of focus of the exposure can be increased.

Particularly preferably, the reticle is tilted relative to the substrate surface to be exposed.

The tilting of the reticle relative to the substrate also makes it possible to achieve in a simple manner the variation of the distance between the reticle and the substrate surface to be exposed, which substrate is arranged onto the carrier, along the direction of movement. As a result of this, a ΔD which is caused by the change in the refractive index of the immersion fluid as a result of the rise in temperature during the scanning of the reticle can once again be compensated for easily and the resolution of the exposure can be improved and/or the depth of focus of the exposure can be increased.

The tilting of the reticle is particularly advantageous since a demagnifying imaging element is usually used in a scanning exposure device. As a result of this, the structure used to expose the substrate can be represented in enlarged fashion on the reticle. Assuming that the structure on the reticle has an extent of 100 nm×100 nm in the X-Y plane of the reticle, then it is imaged onto an area in the X-Y plane of 25 nm×25 nm in the case of an imaging element which effects 4:1 demagnification. However, the imaging element acts not only in the X-Y plane but also in the Z direction, to be precise in such a way that a change in the z position of the reticle by 16 mm brings about a shift in the focus, that is to say the X-Y plane of the sharpest image downstream of the imaging element, by only 1 mm. This corresponds to a "stepping-down" of the shift in the z position. The distance between the reticle and the substrate can thereby be regulated in a simple manner since possible inaccuracies in the regulation of the tilting of the reticle are reduced by a factor of 16.

In one development, the variation of the distance between the reticle and the substrate surface to be exposed proceeds linearly along the direction of movement of the carrier.

To consider it clearly, this means that as the movement of the substrate increases within an exposure field, that is to say a field on the substrate which is exposed by means of a reticle and which represents an individual electronic component after the processing has ended, the variation of the distance between the substrate surface to be exposed has a linear portion, that is to say that the distance becomes linearly larger or smaller. A linear decrease in the distance is advantageous since it can easily be obtained. On the other hand, both the change in the refractive index as a function of the change in the temperature and the change in the z position of the focus as a function of the change in the refractive index are linear to a first approximation. That is to say that dn/dT ≈constant and dz/dn ≈constant. It is apparent from this that in the case of an exposure device which is not a stepper but rather has a scanning mode of operation, Δz, that is to say the change in the focus position in the z direction, is proportional to the exposure energy that a point to be exposed has already experienced, and thus also proportional to the position within an illumination slot with the aid of which the reticle is scanned, which in turn has the effect that for compensating for the focal change it is advantageous to linearly vary the distance between the reticle and the substrate surface to be exposed.

The second direction may be opposite to the first direction.

The temperature of the immersion fluid is preferably regulated.

In the case of an additional temperature regulation of the immersion fluid, the temperature regulation can be used to carry out a coarse control of the depth of focus and/or the resolution of the exposure, while the fine control of the depth of focus and/or the resolution of the exposure is carried out by means of varying the distance between the reticle and the substrate surface to be exposed. That is to say that possible changes in the focus which occur as a result of inaccurate temperature regulation can be compensated for by means of the distance variation.

The imaging element may be a lens or a lens system.

In one development, the immersion fluid is introduced between the imaging element and the substrate during the exposure.

This clearly means that the immersion fluid is injected, during the exposure of a substrate, for example into the interspace between the imaging element and the substrate. Injection represents a method that can be carried out in a simple manner for providing the immersion fluid.

In one development, the distance variations are determined as offsets prior to the exposure of the substrate in a calibration step for the substrate and, during the exposure of the substrate, the offsets that have been determined and stored are used in order to carry out, that is to say set, the distance variations.

In general, the substrate is calibrated prior to the exposure within a lithography in order to correctly orient it later for the exposure. Calibration values are obtained in this case. The offsets which are produced for the compensation for the variations of the best focus position as a result of the change in temperature of the immersion fluid can then be added to said calibration values. Said offsets can be determined by calculating them, for example, or else measuring them in the calibration measurement. The calculation is explained in more detail below.

The calibration, the determination and addition of the offsets can also be carried out by the so-called "on-fly" method. For this purpose, a CCD camera that is generally present in a lithography device may be used for the calibration. In this case, "on-fly" means that the calibration is carried out directly before a directly subsequent exposure step, that is to say within a method that is not subject to any temporal interruption.

To summarize, the invention can be seen in the fact that in an immersion lithography technology, it is not attempted to prevent the effects of a change in temperature of the immersion medium primarily by regulating the temperature, but rather to compensate for this by means of varying the distance between a reticle used and a substrate surface to be exposed. To put it clearly, a relative angle between the reticle used and the substrate to be exposed is set which has a magnitude such that, by means of this relative angle, the distance between the reticle and the substrate surface to be exposed changes during the exposure of the substrate, to be precise to the extent necessary to compensate for the change in the z position of the best focus, which change is caused by the change in temperature of the immersion medium.

The relative angle must be calculated prior to the exposure in order to be able to take it into account during the exposure. In order to calculate it, it is necessary to determine the energy dose which the immersion medium takes up during the exposure, in order to determine therefrom the change in the z position of the best focus. This can be carried out during a calibration step which is already customary anyway and which is carried out for each exposure field of a substrate or per substrate once or at predetermined time intervals. Clearly, each exposure field of a substrate is scanned prior to the actual exposure by means of a calibration device in order to obtain the items of information required for the exposure. In this case, inter alia, a height profile of the substrate surface to be exposed is created in order to carry out an exact lithography. An offset is then also added to said height profile, said offset corresponding to the linearly increasing offset which is caused by the increase in temperature of the immersion medium. It should be taken into consideration that the offset does not have to be measured for every field, rather it generally suffices for the offset to be measured at predetermined time intervals. One criterion for the time intervals is, for example, that it is ensured that no alterations that affect the position of the best focus have arisen between two measurements.

The effects of the change in temperature of the immersion medium primarily reside in the fact that the refractive index of the immersion medium changes. It follows from this that the z position, that is to say the distance at which a sharp image arises downstream of an imaging element, changes with the temperature of the immersion medium. The change in the z position of the focus in turn leads, if it is not compensated for, to a deterioration in the resolution and/or a smaller depth of focus during the exposure of the substrate. The change in the z position is approximately linear over the exposure slot and can therefore be compensated for by tilting the reticle and/or substrate.

BRIEF DESCRIPTION OF THE DRAWING

Exemplary embodiments of the invention are illustrated in the FIG.s and are explained in more detail below.

DETAILED DESCRIPTION

Figure 1:
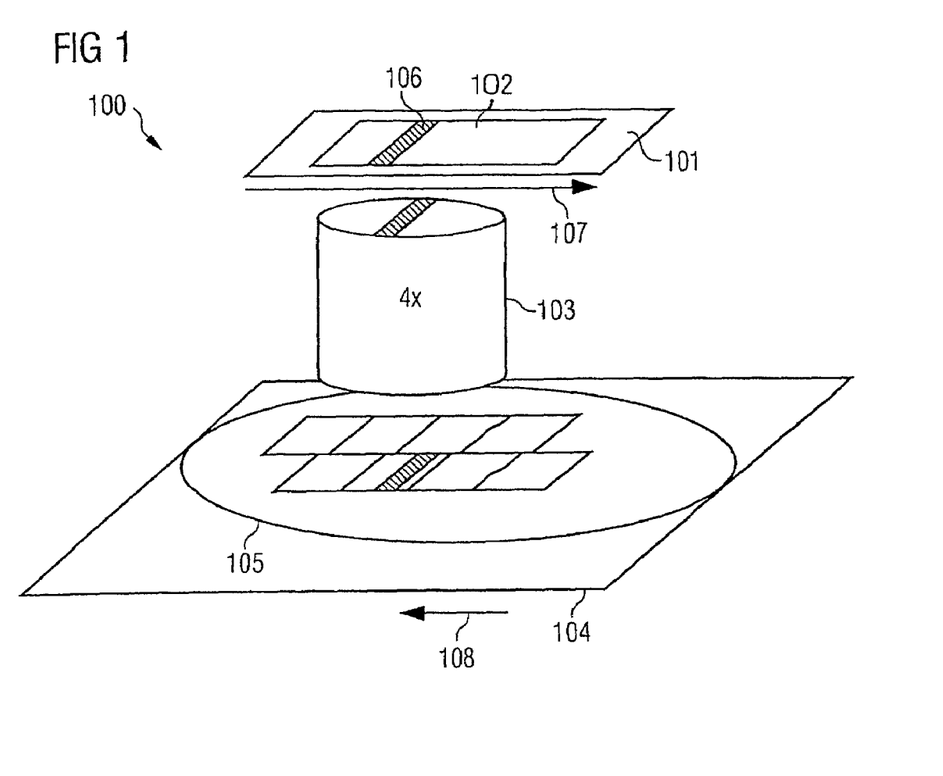
FIG. 1 shows a schematic illustration of a scanning exposure device in accordance with one exemplary embodiment of the invention.

FIG. 1 shows a schematic representation of a scanning exposure device 100 for an immersion lithography. The scanning illumination device is also called a "scanner exposure tool" or scanner for short. For the purpose of improved clarity, no immersion fluid is illustrated in FIG. 1.

A scanner 100 has a holder 101, which accommodates a reticle 102, an imaging element 103, e.g. a lens or a lens system, and a carrier 104, on which a substrate 105 is arranged. The reticle 102 is illuminated from above by a beam source (not illustrated), e.g. a laser, in FIG. 1. The beam from the beam source passes through the reticle 102 and passes further downward in the direction of the substrate in FIG. 1. A so-called exposure slot 106 has the effect that only a small region of the reticle 102 is exposed, that is to say only a small partial region of the reticle 102 is illuminated and the relevant beams can pass into the lens system 103. The exposure slot 106 is indicated as a hatched region within the reticle 102 in FIG. 1. Furthermore, in order to make it clear that only beams from a small partial region pass into the lens system 103, this partial region is illustrated in bright fashion in FIG. 1 on the top side of the lens system 103. The lens system 103 is formed in such a way that it generates a sharp image of structures that are present on the reticle 102 on the substrate 105. The region of the substrate 105 which is currently being exposed is in turn illustrated as a bright strip in FIG. 1. In general, the beam is emitted in pulsed fashion, so that a large number of short beam pulses are used to expose the substrate 105.

In order to image all the structures of the reticle 102 on the substrate 105, the reticle 102 moves relative to the exposure slot 106. In FIG. 1, this movement and the direction thereof are indicated by a first arrow 107 toward the right. Through the movement of the reticle 102 relative to the stationary exposure slot 106, the entire reticle is scanned by the beam from the beam source and imaged on the substrate 105. In order to attain a sharp imaging on the substrate 105, however, the substrate 105 must also be moved. In general, the movement of the substrate 105 will be opposite to the movement of the reticle 102 since a simple lens system generates an image which is inverted. In other words, in FIG. 1, the carrier 104, on which the substrate 105 is arranged, moves toward the left, which is indicated by a second arrow 108.

In the case of the movement of the reticle 102 and the carrier 104, it must be taken into consideration that in general a lens system is used which does not image the structures arranged on the reticle 102 onto the substrate on a scale of 1:1. In FIG. 1, the "4x" on the lens system schematically indicates that the structures are imaged onto the substrate on a scale of 4:1. In this case, the speeds of the movements of the reticle 102 and of the carrier 104 have to be adapted to the imaging scale. In general, a lens system which demagnifies the structures is used. If a lens system which demagnifies the structures e.g. by the factor four is used, then the speed at which the reticle is moved must be greater by the factor four than the speed at which the carrier 104 and hence the substrate 105 are moved.

Figure 2:
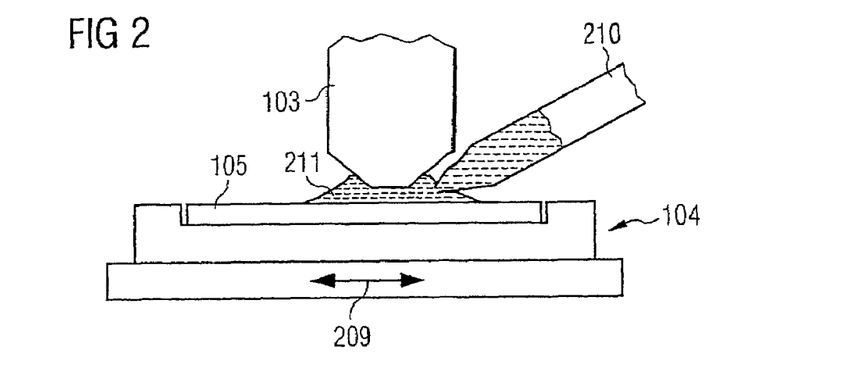
FIG. 2 shows a schematic illustration illustrating the introduction of an immersion fluid.

FIG. 2 then schematically shows how an immersion fluid can be introduced between the lens system 103 and the substrate 105.

FIG. 2 shows a side view of a detail from the arrangement for an immersion lithography method according to the invention.

FIG. 2 illustrates the lens system 103, the carrier 105 and the substrate 105. The holder 101, the reticle 102 and the exposure slot 107 are not illustrated in FIG. 2 for the sake of clarity. The movement of the carrier 104 is illustrated by the double arrow 209. The latter is intended to indicate that the carrier 104 can move in two directions depending on how the reticle 102 (not illustrated) moves. In addition, FIG. 2 symbolically illustrates a supply line 210, by means of which an immersion fluid 211 can be introduced between the lens system 103 and the substrate 106. In the exemplary embodiment, the immersion fluid is high-purity water, that is to say water which is low in impurities such as, for example oxygen or impurities, or a perfluoropolyether, such as, for example, the perfluoropolyether known by the trade name Krytox®.

FIG. 3 schematically shows the profile of the temperature of the immersion fluid and the z position of the focus, along the position of the exposure slot.

Figure 3A:
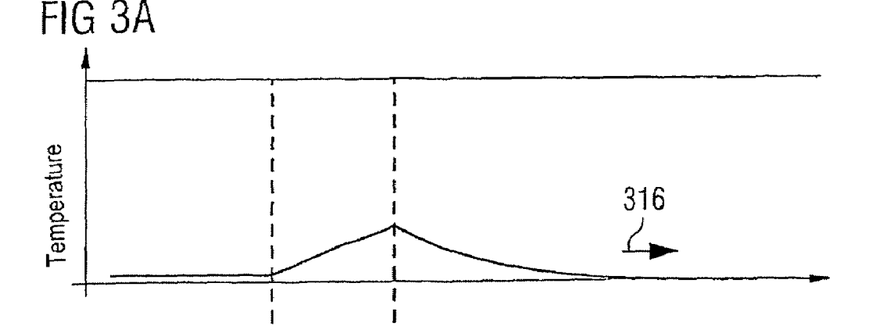
FIG. 3 shows a schematic illustration of the temperature of an immersion fluid during an exposure and the position of the focus in relation to the position within the exposure slot.

In FIG. 3a, the ordinate (Y axis) represents the temperature of the immersion fluid in arbitrary units and the abscissa (X axis) represents the x position on the substrate. FIG. 3a clearly illustrates a snapshot of the temperature over the position on the substrate. In addition, the dashed lines 312 and 313 specify the region into which the exposure slot is imaged. The two dashed lines 312 and 313 clearly represent the first and second edge boundaries of the exposure slot. In FIG. 3a, the substrate moves toward the right, which is indicated by the arrow 316. The movement of the substrate toward the right has the consequence that the temperature of the immersion fluid continuously increases from the region of the substrate which, through the movement of the carrier, is currently penetrating into the region into which the exposure slot is imaged (312) to the region of the substrate which is currently leaving the region into which the exposure slot is imaged (313). This continuous increase in the temperature is associated with the fact that the immersion fluid, which is introduced into the interspace between the lens system and the substrate, practically adheres to the substrate surface and thus moves concomitantly with the substrate. Consequently, the immersion fluid, which, in FIG. 3, at the dashed line 313, is currently leaving the region into which the exposure slot is imaged, has been subjected longest to the exposure and has thus been subjected the most greatly to a temperature increase through the partial absorption of the laser beam. After the substrate has left the region into which the exposure slot is imaged, the temperature of the immersion fluid decreases again.

Figure 3B:
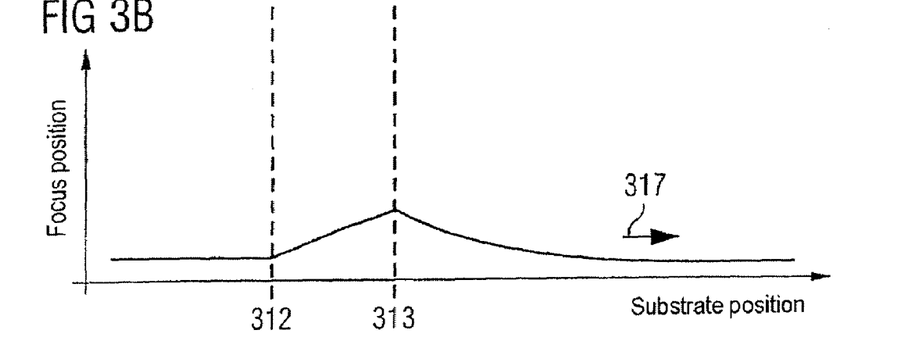

In FIG. 3b, the ordinate (Y axis) represents the z position of the best focus and the abscissa (X axis) represents the x position on the substrate. FIG. 3b clearly illustrates a snapshot of the z position of the plane in which a sharp image is generated over the position on the substrate. In addition, the dashed lines 312 and 313 again specify the region into which the exposure slot is imaged. In FIG. 3b, the substrate moves toward the right, which is indicated by the arrow 317. This can be seen analogously to FIG. 3a. The movement toward the right of the substrate has the consequence that, as shown in FIG. 3a, the temperature, with the latter the refractive index and thus also the z position of the best focus illustrated in FIG. 3b changes continuously in the region of the substrate which, through the movement of the carrier, is currently penetrating into the region into which the exposure slot is imaged (312) to the region of the substrate which is currently leaving the region into which the exposure slot is imaged (313). The z position of the best focus moves closer and closer to the lens system. This continuous variation of the z position is associated with the continuous rise in the temperature of the immersion fluid, since the refractive index is to a first approximation proportional to the temperature and the z position is in turn to a first approximation proportional to the refractive index. Consequently, the profile of the z position of the best focus illustrated in FIG. 3b follows the profile of the temperature illustrated in FIG. 3a.

Figure 4:
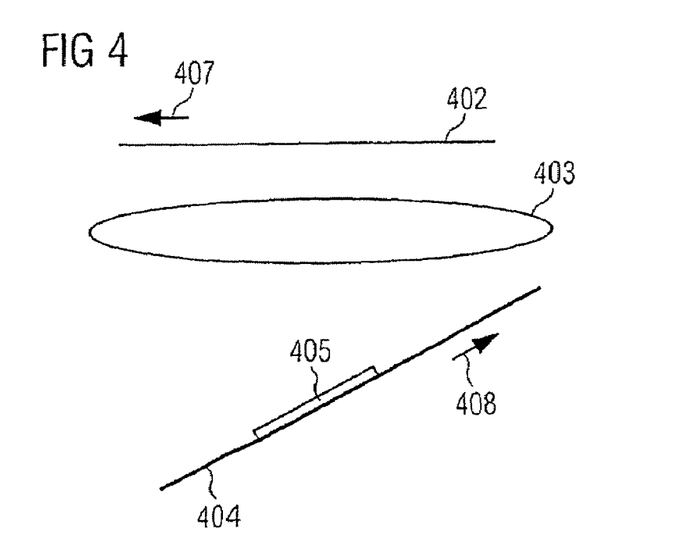
FIG. 4 shows a schematic side view of a scanning exposure device in accordance with a first exemplary embodiment of the invention.

FIG. 4 illustrates a schematic side view of a scanning exposure device in accordance with a first exemplary embodiment of the invention. The scanning exposure device of FIG. 4 has a reticle 402 an imaging element 403, which is schematically illustrated as an individual lens in FIG. 4, and a carrier 404, on which a substrate 405 is arranged. An immersion fluid, which is not illustrated in FIG. 4 for the sake of clarity, is introduced between the substrate 405 and the lens 403 during the exposure of the substrate.

In the first exemplary embodiment, the distance between the reticle 402 and the surface to be exposed of the substrate 405 is varied in the direction of movement, or to put it another way during the movement, by means of the carrier 404 being moved obliquely with respect to the reticle 402. The direction of movement of the reticle 402 is indicated by a first arrow 407 and is toward the left in FIG. 4, while the direction of movement of the holder 404 and thus of the substrate 405, which runs toward the right in FIG. 4, is indicated by a second arrow 408.

In order to illustrate the invention, the obliquity of the movement of the carrier 404 relative to the orientation of the reticle 402, that is to say the relative angle formed by the reticle 402 and the carrier 404, has been represented in a greatly exaggerated manner in FIG. 4. On a correct scale, the relative angle that would have to be set in order to compensate for the focus position change produced by the heating of the immersion fluid would not be discernible in the FIGURE.

A brief explanation is given below of how it is possible to determine the size of the variation of the distance between the reticle and the substrate.

In a conventional lithography exposure device, also called an "exposure tool", a calibration is carried out prior to the actual exposure at each field of the substrate, a so-called exposure field, which contains individual electronic components after completed processing. Said calibration is generally necessary since, for a correct exposure, that is to say an exposure with a small resolution, the individual substrate has to be measured accurately, for example in terms of its height profile. The calibration measurement then yields, inter alia, a height profile of an individual exposure field within the substrate. An offset, which as a result of the z position shift of the best focus that follows from the change in temperature of the immersion fluid can then also simply be added to said height profile. The value of the offset rises, as illustrated in FIG. 3b, to a first approximation, linearly in the region of the exposure field which is currently just being exposed through the exposure slot. The offset, which arises as a result of the change in temperature of the immersion fluid, can be determined in a manner corresponding to the calibration measurement and be stored. Two calibrations are preferably carried out, in which case, in a first calibration, each exposure field is measured prior to the exposure and, in a second calibration, the offset is measured once for a given installation. The offset can then be corrected as required, that is to say according to the conditions at the start of the exposure of each substrate or wafer, or hourly, daily or at other given time intervals. Once the offset has been stored, e.g. in the form of a table, a so-called "look-up table", it can then be taken into account in a subsequent exposure of the exposure field by being added to the height profile of the exposure field. The storage may take place for example in a memory of a computer, which computer can also be used in carrying out and evaluating the calibration measurement and/or in determining the offset. The storage affords the advantage that the same offsets can be used repeatedly if identical exposures, that is to say an exposure process having identical parameters, such as, for example, exposure time, photoresist, reticle, etc., are carried out. This obviates new calculations and/or new measurements of the offsets.

In order to determine the offset, it is necessary to determine the rise $\delta T$ in temperature of the immersion fluid along the movement of the carrier. From this rise $\delta T$ in temperature of the immersion fluid along the movement direction, it is possible to calculate the change in the refractive index $\delta n$ given known dn/dT. To a first approximation, dn/dT can be assumed as a material constant of the immersion fluid for this purpose. $\delta T$ can be determined by means of equation (3):

$$\delta T = (1-\tau)\gamma/cD$$

Where: $\delta T$ is the rise in temperature,
$\tau$ is the transmission coefficient of the immersion fluid, $\gamma$ is the energy dose required to expose the photoresist used during the exposure,
c is the specific heat of the immersion fluid, and
D is the distance between the imaging element and the substrate, that is to say the working distance.

Consequently, for the defocusing, that is to say the shift in the z position of the best focus, as a result of the change in temperature of the immersion fluid, to a first approximation, this results in equation (2) already specified above $$\Delta D = \frac{D \cdot \delta n}{n \cdot \cos^2 \theta}$$

From this it is then possible to calculate the required variation of the distance along the entire region on the substrate onto which the exposure slot is imaged, that is to say the region in FIGS. 3a and 3b between the lines 312 and 313. For the linear approximation of the speed of the variation of the z position of the best focus, that is to say the necessary speed of the substrate in the direction of the z coordinate, equation (2), equation (3) and $$\delta n = \frac{dn}{dT}.$$

$\delta T$ give rise to the following equation (4)

$$\frac{\Delta D}{\Delta t} = \frac{\frac{dn}{dT} \cdot (1-\tau) \cdot \gamma}{c \cdot n \cdot \cos^2 \theta} \cdot \frac{1}{\Delta t}$$

where $\Delta t$ is the time for which a point on the substrate is exposed, that is to say the time required by a point in order, once it has penetrated into the region of the exposure slot, to leave this region again, to put it another way the time required by a point on the substrate in order to cover the distance from the dashed line 312 as far as the dashed line 313 in FIGS. 3a and 3b.

From equation (4) it is possible, as explained above, to calculate a speed in the z direction which the substrate surface to be exposed has in order to compensate for the change in the refractive index of the immersion fluid as a result of the increase in temperature of the immersion fluid during the exposure. In this case, the direction of the speed in the z direction depends on the sign of dn/dT; generally this is such that the distance between the substrate surface to be exposed and the imaging element decreases along the direction of movement in order to compensate for the changes caused by the temperature changes, as also emerges from FIG. 3b.

The speed in the z direction can also be converted in a simple manner into a relative angle which the substrate surface to be exposed must have with respect to the reticle.

In addition to the above-described calculation of the shift in the best focus in the z direction, the shift in the best focus can also be determined experimentally. The experimental determination is simpler to carry out, under certain circumstances, than the analytical method described. By way of example, the parameters required for the calculation need not necessarily be known in this case. The z position shift of the best focus is simply measured for a given exposure device.

Figure 5:
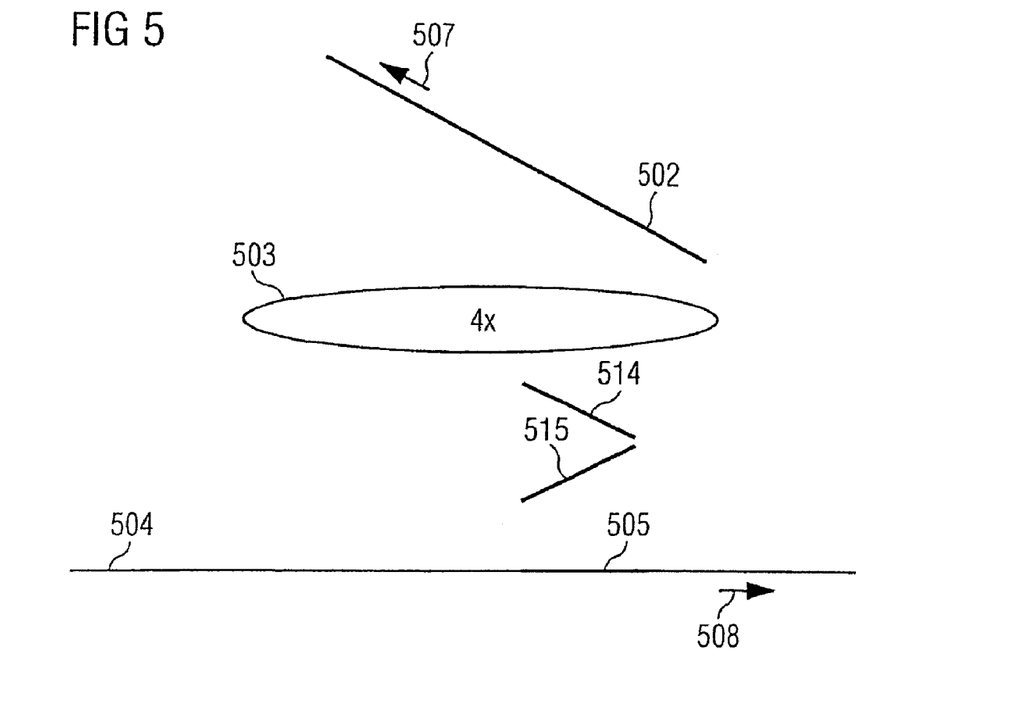
FIG. 5 shows a schematic side view of a scanning exposure device in accordance with a second exemplary embodiment of the invention.

FIG. 5 illustrates a schematic side view of a scanning exposure device in accordance with a second exemplary embodiment of the invention. The scanning exposure device of FIG. 5 has a reticle 502, an imaging element 503, which is illustrated schematically as an individual lens in FIG. 5, and a carrier 504, on which a substrate 505 is arranged. An immersion fluid introduced between the substrate 505 and the lens 503 is not illustrated in FIG. 5 for the sake of clarity.

The illustration does, however, also show two planes that are intended to help to explain the functioning of the second exemplary embodiment. In the second exemplary embodiment, the carrier 504 with the substrate 505 is not moved obliquely, rather the reticle 502 is moved obliquely. By this means, too, it is possible to compensate for the shift in the z position of the sharpest image that is caused by the temperature increase and the change in refractive index correlated therewith. It must be taken into consideration in this case that an imaging element that effects a demagnification is usually used. This is illustrated symbolically in FIG. 5 by the "4×" depicted in the symbolic lens 403. A demagnification on the scale of 4:1 has an effect at the distance of the best focus and thus in the z direction with a factor of 16, that is to say the demagnification factor squared $(4:1)^2$. This means that the reticle 502 has to be tilted to a significantly greater extent during the movement than the substrate 405 in the first exemplary embodiment illustrated in FIG. 4. The speed in the z direction that results from equation (4) or the resulting relative angle must be increased by said factor of 16.

In order to illustrate these facts, FIG. 5, as already stated, also depicts two planes. The first plane 514 shows the "tilting" of the image of the reticle 502 generated by the lens 503. For the reason mentioned above, this first plane 514 has a weaker degree of tilting than the reticle 502 itself. The first plane 514 specifies the position, or the tilting, which the surface to be exposed of the substrate 505 would have to have in a lithography device which would have no effects of the change in refractive index as a result of an irradiation of a medium between the lens 503 and the substrate 505. Since, however, the invention involves the use of an immersion lithography device in which an immersion fluid is introduced between lens 503 and substrate 505, a tilting of the image, or to put it another way a variation of the z position (distance) of the best focus, arises as a result of the change in the refractive index with the temperature. This tilting is illustrated by means of a second plane 515 in FIG. 5. The second plane specifies the variation of the best focus as a result of the change in temperature. In order to obtain the plane of the best focus after the effects of the change in refractive index as a result of the change in temperature in the immersion fluid and the tilting of the reticle, the tilting of the first plane 514 and of the second plane 515 is "added together". This yields the resulting imaging plane on which the image of the reticle is imaged the most sharply. In FIG. 5, the inclinations of the first plane 514 and of the second plane 515 are illustrated such that they are equal in magnitude but have opposite signs, so that the resulting imaging plane in FIG. 5 is horizontal.

Consequently, in the second exemplary embodiment illustrated in FIG. 5, a sharp image of the reticle 502 arises on the surface to be exposed of the substrate 505 if the surface to be exposed of the substrate 505 is moved in the horizontal direction below the lens system 503 in FIG. 5.

To summarize, the invention can be seen in the fact that in an immersion lithography technology which is carried out by means of scanning exposure device, the variations in the position of the best focus, that is to say the sharpest imaging, which as a result of the change in the refractive index of the immersion medium with the change in the temperature of the immersion medium as a result of absorption in the immersion medium, in contrast to the prior art are not prevented solely by regulating the temperature of the immersion medium, rather a compensation of these focus variations is carried out by varying a distance between the reticle and a substrate surface to be exposed along the direction of movement of the substrate. The change in the distance corresponds to an offset, which is added to the normal movement of the substrate and/or reticle, that is to say the movement such as is performed by a substrate and/or reticle in an immersion lithography device in accordance with the prior art. The value of said offset can be calculated by means of equation (4) specified above. Said offset can be understood as a linear movement in the z direction, that is to say the direction of an optical axis of the scanning exposure device. In the scanning exposure device, the optical axis corresponds to the axis along which a beam, e.g. a laser beam, which is used for the exposure propagates.

The invention claimed is:

1. An immersion lithography method for the exposure of a substrate wherein the method is carried out by means of a scanning exposure device including:
    a beam source, which generates a beam for exposing the substrate;
    a holder, which accommodates a reticle;
    a carrier, on which a substrate is arranged, whereby the distance between the reticle and the substrate is alterable during exposure of the substrate;
    an imaging element, which is arranged between the reticle and the substrate; and a computer;
    the method comprising:
    introducing an immersion fluid between the imaging element and the substrate and exposing the substrate to the beam, wherein the beam passes from the radiation source through the reticle, the imaging element, and the immersion fluid onto a surface of the substrate; and
    scanning the beam across the reticle in a first direction while moving the carrier in a second direction, wherein a depth of focus and/or an exposure resolution of the substrate is set by applying a distance variation in the distance between the reticle and the substrate surface which varies linearly along the second direction while exposing the substrate;
    wherein the distance variation is supplied by the computer and is determined in dependence on the variation of change in the depth of focus and/or an image resolution caused by a change in temperature of the immersion fluid while exposing the substrate.

2. The method as claimed in claim 1, wherein introducing an immersion fluid comprises introducing a fluid having a high transparency at a given exposure wavelength and/or having a small change in refractive index with temperature.

3. The method as claimed in claim 1, wherein introducing an immersion fluid comprises introducing one of water or a perfluoropolyether.

4. The method as claimed in claim 1, wherein moving the carrier comprises moving the carrier obliquely with respect to the reticle.

5. The method as claimed in claim 1, further comprising moving the reticle obliquely relative to the substrate surface.

6. The method as claimed in one of claims 1, wherein the distance in the beam scan direction varies linearly between the reticle and the substrate surface along the second direction.

7. The method as claimed in claim 1, in which the second direction is opposite to the first direction.

8. The method as claimed in claim 1, further comprising regulating the temperature of the immersion fluid.

9. The method as claimed in claim 1, wherein the imaging element comprises one of a lens or a lens system.

10. The method as claimed in claim 1, wherein introducing an immersion fluid comprises introducing the immersion fluid between the imaging element and the substrate during the exposure.

11. The method as claimed in claim 1, wherein the method further comprises determining the distance variations as offsets prior to the exposure of the substrate in a calibration step for the substrate and, during the exposure of the substrate, using the offsets to carry out the distance variations.

12. A device for carrying out immersion lithography for the exposure of a substrate, the device comprising:
  a beam source for emitting a beam;
  a carrier configured to accommodate a substrate; a holder for accommodating a reticle; wherein the carrier and the holder are arranged such that they can be moved and oriented in relation to one another;
  an imaging element, arranged between the holder and the carrier; and
  a computer;
  wherein the device is configured such that an immersion fluid can be introduced between the imaging element and the carrier;
  wherein the device is configured such that a relative tilt is applied to the reticle arranged in the holder and a substrate surface to be exposed so that both the reticle and the substrate experience a relative orientation relation to one another during the exposure of a surface of the substrate;
  and wherein the angle of the tilt is supplied by the computer and compensates for a change in a depth of focus and/or an image resolution caused by a change in temperature of the immersion fluid during the exposure of the surface.

13. The device as claimed in claim 12, wherein the holder is configured to move in a first direction relative to the beam source and the carrier is configured to move in a second direction substantially opposite to the first direction.

14. The device as claimed in claim 12, wherein the immersion fluid comprises one of water or a perfluoropolyether.

15. The device as claimed in claim 12, wherein the carrier is configured to move obliquely with respect to the reticle.

16. The device as claimed in claim 12, wherein the holder is configured to move obliquely relative to the carrier.

17. The device as claimed in claim 12, wherein the imaging element comprises one of a lens or a lens system.

18. The device as claimed in claim 12, wherein the immersion fluid comprises one of a high transparency fluid at a given exposure wavelength or a fluid having a small change in refractive index with temperature value, a fluid have both a high transparency and a small change in refractive index with temperature value.

19. The device as claimed in claim 12, wherein the beam source comprises a laser source.

20. The device as claimed in claim 12, wherein the imaging element comprises a demagnifying imaging element.

21. A method for performing a calibration of an immersion lithography device for the exposure of a substrate, the immersion lithography device comprising:
  a beam source for emitting a beam;
  a carrier configured to accommodate a substrate; a holder for accommodating a reticle; wherein the carrier and the holder are arranged such that they can be moved and oriented in relation to one another;
  an imaging element, which is arranged between the holder and the carrier, wherein the device is configured such that an immersion fluid can be introduced between the imaging element and the carrier;
  the method including:
  determining the position of best focus during calibration resulting from a change in a depth of focus and/or an image resolution caused by a change in temperature of the immersion fluid during the exposure of the surface of the substrate; and
  determining a distance variation to be applied to the distance between the reticle and substrate during exposure, to compensate for the change in temperature of the immersion fluid during the exposure of the surface of the substrate.

* * * * *

UNITED STATES PATENT AND TRADEMARK OFFICE
CERTIFICATE OF CORRECTION

PATENT NO. : 7,420,652 B2  Page 1 of 1
APPLICATION NO. : 11/386483
DATED : September 2, 2008
INVENTOR(S) : Martin Niehoff It is certified that error appears in the above-identified patent and that said Letters Patent is hereby corrected as shown below:

On the Title Page

Item (30), line 1, under Foreign Application Priority Data, delete "103 44 567" and substitute --103 44 567.6-- in its place.

In the Claims

In column 14, claim 6, line 58, after "as claimed in" delete "one of claims" and substitute --claim-- in its place.

In column 16, claim 18, line 10, after "value, a fluid" delete "have" and substitute --having-- in its place.

Signed and Sealed this

Twenty-seventh Day of July, 2010

David J. Kappos
*Director of the United States Patent and Trademark Office*